April 5, 1938. L. PUNGS Re. 20,691

TELEPHONIC TRANSMITTER

Original Filed May 2, 1932 3 Sheets-Sheet 1

Inventor:
Leo Pungs
by R. C. Hopgood
Attorney

TELEPHONIC TRANSMITTER

Original Filed May 2, 1932 3 Sheets-Sheet 2

Inventor:
Leo Pungs
by R. C. Hopgood
Attorney

April 5, 1938. L. PUNGS Re. 20,691

TELEPHONIC TRANSMITTER

Original Filed May 2, 1932 3 Sheets-Sheet 3

Inventor:
Leo Pungs
by R. C. Hopgood
Attorney

Reissued Apr. 5, 1938 Re. 20,691

UNITED STATES PATENT OFFICE 20,691

TELEPHONIC TRANSMITTER

Leo Pungs, Brunswick, Germany

Original No. 1,999,143, dated April 23, 1935, Serial No. 608,609, May 2, 1932. Application for reissue March 20, 1937, Serial No. 132,125. In Germany May 2, 1931

15 Claims. (Cl. 250—6)

A modulating arrangement for wireless transmitters has been proposed wherein the intensity of the carrier frequency varies in accordance with the intensity of modulation. In this method, the carrier current is not kept constant, as was usual, but is varied in proportion to the modulation intensity so that if the volume is small, less energy is radiated. This results in a saving of energy, and the reduction at the receiver of disturbances such as atmospheric disturbances or those caused by the heterodyning of transmitters. The method, however, has the disadvantage that distortions arise at the receiver since the rectifiers customary at the present day have a non-linear, for instance, quadratic operation. These distortions have the effect that if the modulation intensity is low, the reproduction at the receiver is still further weakened, but if the intensity is high the reproduction is strengthened. Therefore, the intensity of reproduction is distorted. In other words, the relationship between "loud" and "soft" is exaggerated.

The invention has for its object to do away with such distortion. It does so by measures adopted at the transmitter and which mainly consist in so varying the carrier frequency amplitudes as to compensate in advance distortions effected at the receiver.

The invention will be understood from the following description and be particularly pointed out in the appended claims, reference being had to the accompanying drawings in which—

Figure 1:
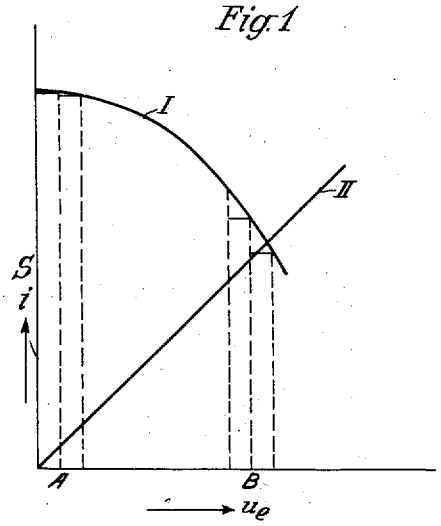
Figure 3:
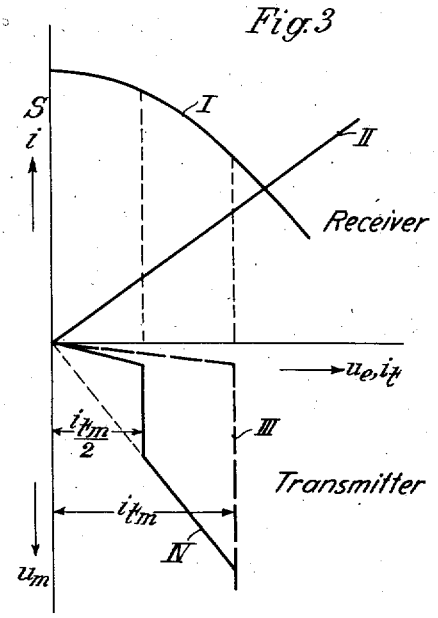
Figure 4:
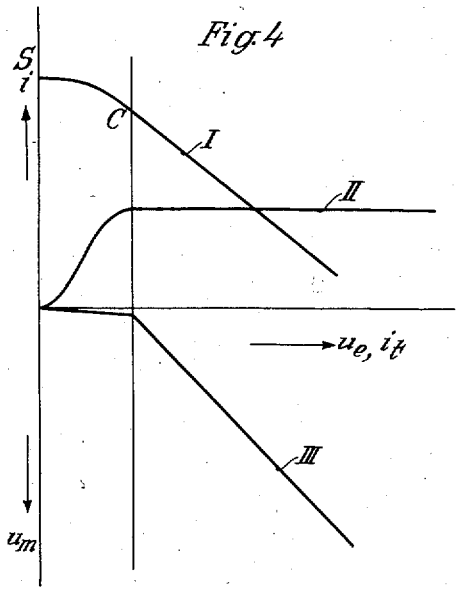
Figure 5:
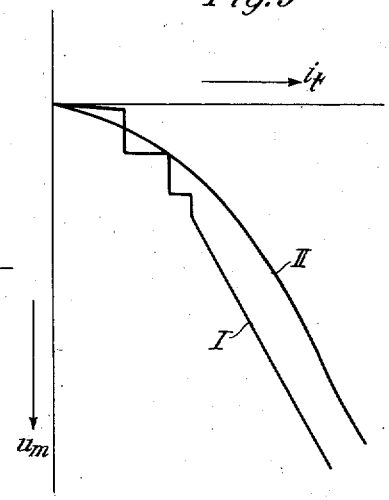
Figure 2:
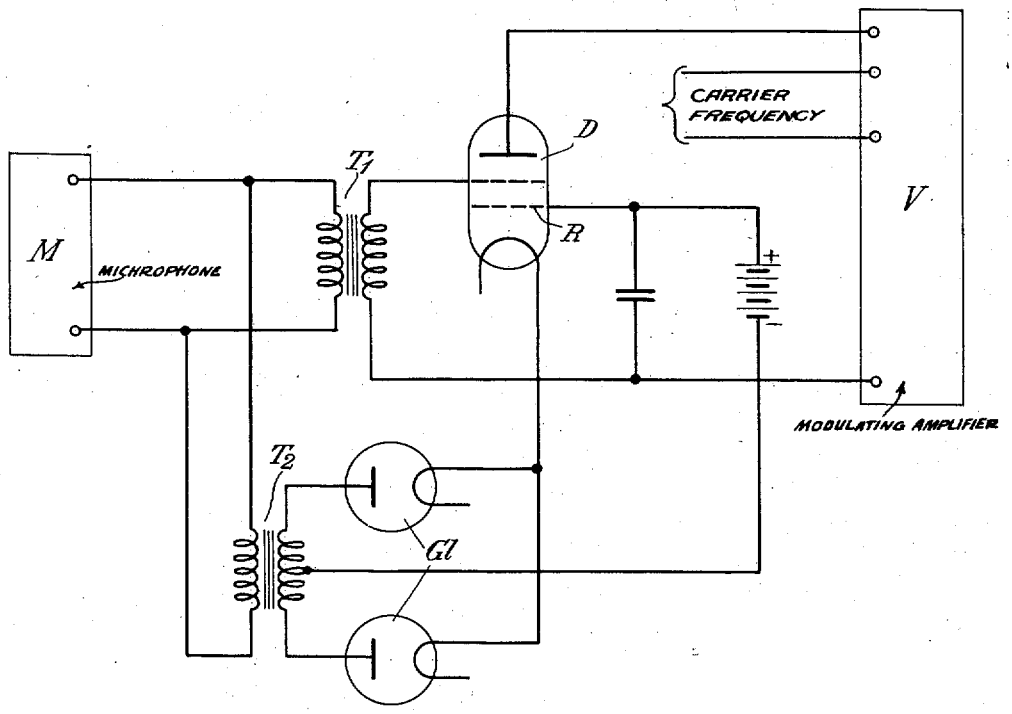
Figure 6:
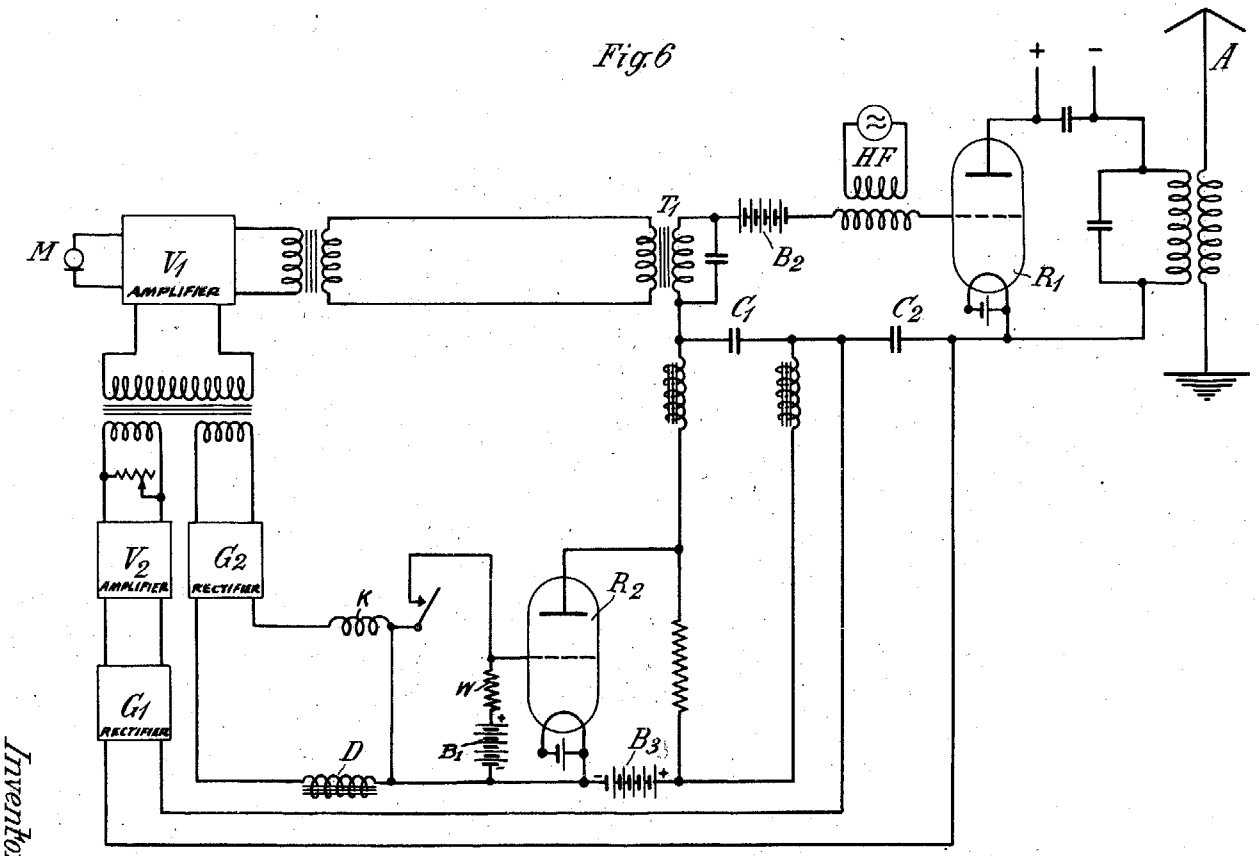

Fig. 1 is a diagram illustrating the operation of the receivers with the prior arrangements at the transmitter hereinbefore referred to. Fig. 2 shows the circuit arrangement of one embodiment of the invention. Figs. 3, 4 and 5 are diagrams that relate to the operation of other embodiments of the invention. Fig. 6 represents the circuit arrangement of the embodiment to which Fig. 4 refers.

In Fig. 1 the output current $i$ of the valve detector (curve I) and the gradient S (curve II) is plotted against the input voltage $ue$. Curve I is the demodulation curve of an audion circuit, the first part of this curve being assumed to be quadratic. It can easily be seen that when working with a variable carrier current, the working point for low intensity modulation is located, for instance, at A, and for high intensity modulation it lies at B, and thus the output currents of the receiver, with reference to equal modulation amplitudes, are subjected to very large fluctuations. This can also be seen from the gradient curve II in Fig. 1. In a first approximation it may be assumed that the mean intensity is proportional to the gradient curve I. The gradient curve for a quadratic curve is a straight line (II in Fig. 1); with small carrier currents, therefore, a very small intensity is obtained, which, in the limiting case, is zero. The intensity increases in proportion with the carrier current. The intensity distortion would therefore be exceedingly great if a proportionally variable carrier current is employed.

A practical form of the invention comprises increasing the small amplitudes of the modulation frequencies at the transmitter to the same extent as they are weakened at the receiving end on account of the quadratic rectification characteristic. The carrier current then fluctuates in intensity in accordance with these intentionally distorted modulation amplitudes and not in proportion to the modulation amplitudes normally employed.

In order to obtain a variable amplification of the small and large amplitudes a circuit arrangement may advantageously be employed embodying a double-grid tube, the gradient of the characteristic of which, as is well-known, is dependent upon the space charge voltage. This voltage itself is varied in accordance with the modulation amplitudes. To such end, a relatively simple additional apparatus to the transmitter may be employed, that is, an apparatus which can easily be removed again. With this apparatus it is also possible to compensate intensity distortions produced by any part of the transmitting installation.

This additional apparatus is the one illustrated in Fig. 2. The currents derived from the circuit of the microphone M act on two transformers T1 and T2 connected in parallel. The secondary of the transformer T1 is connected to one grid of a double-grid tube D. The secondary of the transformer T2 is connected to a two-way rectifier which, in the example illustrated, comprises two rectifier tubes G1. The voltage applied to the space-charge grid R is dependent upon the magnitude of the rectified modulation currents. The conditions are now chosen such that the alteration of the characteristic of the tube D is just sufficient to compensate for the distortion of the intensity relationship between "loud" and "soft" which arises at the receiving end. In the anode circuit of the tube D is connected the modulation amplifier V of the transmitter proper, which operates with a varying carrier frequency amplitude.

With this method, however, very high degrees of amplification, of infinite value in the limiting case, would have to be used for the small amplitudes. Moreover, distortion and over-modulation may also easily occur.

For this reason, according to a further feature of the invention, the carrier frequency amplitude is varied in non-linear relation with the modulation amplitudes actually employed for modulation. The amplitudes actually employed for modulation may be already intentionally distorted in intensity in accordance with the first form of execution of the invention, although they need not be. The object of this deviation from the linear relation is that intensity distortion and sound distortion may not occur or are only present up to a certain degree permissible in practice. This proposed deviation is hereinafter referred to as "adaptation of the carrier current to the demodulation characteristic."

The fundamental idea of this method can be seen from Figs. 3 and 4. Curve I of Fig. 3 is again the demodulation characteristic, it being assumed to be a purely quadratic curve (parabola) over the first part. The straight line II is the gradient curve for the parabola (that is, the first differential coefficient as a function of the voltage).

If reproduction is required in which the intensities correspond exactly to the intensities of modulation, the carrier current would only have to be jumped from zero to a maximum value (the constant value employed in the methods of transmission customary at the present day), since there are not several points of equal gradient on the demodulation characteristic. The curve III is then obtained as the variation curve of the carrier current (*it*). This curve represents the carrier current of the transmitter (*it*) or the voltage proportional to it at the receiver (*ue*) as a function of the modulation voltage (*um*), and is plotted in the downward direction in Fig. 3. In the intervals, the current is zero and rises immediately at very small values of the modulation voltage to the constant maximum value *itm*. Thus the carrier current is dependent upon the modulation intensity in this case, although in a coarser form. The advantage in this case over the method customary at the present day is limited to the absence of the carrier current in the complete absence of modulation.

A much better utilization of the method of variable carrier current is possible according to the invention when some variation of the intensity relationship is permitted, say up to 50% as the maximum variation of intensity for the weak points. If it is borne in mind that, for instance, in the broadcast reproduction of orchestral and singing performances, the distortion of intensity is much greater, such an intensity variation can be permitted without hesitation. Then for the curve of the carrier current adapted according to the invention, the curve IV in Fig. 3 is obtained. It is seen that the current rapidly rises, in the first instance, to the value *itm*/2 which is half of the otherwise constant maximum carrier current (corresponding to the permissible 50% of the maximum intensity distortion) and remains at this value until the mean modulation value approximately attains the value of the carrier current; from here the carrier current rises in proportion to the modulation value of the voltage. Since, at the value *itm* of the carrier current, the gradient as shown on curve II is only half as great as with the maximum carrier current *itm*, the intensity distortion amounts to as much as 50%. The intensity distortion, although it amounts to as much as 50%, is, however, smaller in this example than if the invention is not applied in the method employing a fluctuating carrier frequency amplitude, that is, if the carrier current varies in proportion to the modulation amplitude.

The circumstances are considerably more favorable for modern receivers, wherein the demodulation curve comprises a relatively short quadratic part, which then straightens into an approximately straight line, as is represented by curve I in Fig. 4. The gradient curve for this appears somewhat like II in Fig. 4. According to the invention, the carrier current would then be varied according to curve III. For small values of the modulation voltage, the value of the carrier current rises in such a manner or is initially of such magnitude that the point C on the characteristic of reception at which the straight part commences, is reached. From here the carrier current rises in a straight line (III) corresponding to the constant gradient, which is represented by curve II.

The desired adaptation of the carrier current can also be obtained by effecting the rise in more than one step in the manner represented in Fig. 5 by curve I. Moreover, continuous curves with a variable gradient may be used, such as for instance the curve II of the same drawing. It is also unnecessary to allow the current to drop to zero in the complete absence of modulation. In all these modifications of the second form of execution of the invention, the fundamental idea is always the same; the carrier current is not just varied approximately in proportion to the normal or intentionally distorted modulation voltage, but is adapted in its variation to the reception characteristic. The result of this is that the intensity distortion is reduced to a degree permissible in practice, the advantages of varying the carrier current in accordance with the degree of modulation being maintained.

Various forms of execution of this method are, of course, possible. The carrier current may be caused to vary according to a given curve, by employing the variable characteristic of electron tubes or, in order to allow the carrier current to rise suddenly, tripping arrangements or glow-discharge relays or other well-known means may be used.

The latter feature is involved in the arrangement shown in Fig. 6. The carrier current may have to be varied according to a curve such as that represented at III in Fig. 4. A valve R1 supplying the antenna A of a separately excited transmitter is supplied with high frequency energy from a source HF. The modulation of the transmitter is effected in the grid circuit from the microphone M through an amplifier V1 and a transformer T1. The opposing voltage of a battery B2 causes the suppression of the carrier current during periods of no modulation. A voltage dependent upon the modulation amplitude is supplied through an amplifier V2 and a rectifier G1 to a condenser C2 of the grid circuit in such a manner that it opposes the battery voltage and displaces the working point of the tube so that a carrier current of variable magnitude is produced. In order to effect the rapid increase of the carrier current for small modulation amplitudes a second path is branched off from the modulation circuit, through a rectifier G2 to an electric tripping relay K. This relay closes the circuit of the battery B1 at small modulation voltages, and through the tube R2 produces at the condenser C1 an additional voltage which brings the carrier current immediately to the desired value. From this point the carrier current then varies with the modulation voltage approximately in a straight line as shown in Fig. 4. A choke coil D is so dimensioned that the relay K responds to the slower variations of the modulation intensity, but not to the sound oscillations.

In order to assist the compensation of the intensity distortion, a variable modulation amplification can also be used in addition to the adaptation of the carrier current, as described above with reference to Fig. 2. In this case the device VI shown in Fig. 6 comprises not only a simple amplifier but also the special arrangement of A. F. circuits of Fig. 2. Both forms of execution of the invention are then simultaneously used. If the carrier current is not proportionally varied, but is adapted to the shape of the receiver curve, the working point can be displaced right at the beginning into an area where the gradient differs from zero, that is, has a finite value even for small values of the modulation voltage, so that the variable amplification also receives possible and practical values. In contradistinction thereto, it was necessary when using the variable amplification without using the second form of construction of the invention, as stated above, to use very large degrees of amplification which are infinite in the limiting case, for the small amplitudes.

The fundamental idea of the invention can still be extended. By the adaptation of the carrier current to the reception curve it is possible not only to reduce the intensity distortion caused thereby but also to remove wholly or partly an intensity distortion caused by the receiving apparatus. For instance, if the difference of the modulation intensity between "loud" and "soft" is too small, a compensation may be provided at the receiver by adapting the carrier current to a point where the difference will be greater.

The invention can be employed not only for wireless transmission, but also for carrier current telephony. The invention besides is not restricted in scope to the embodiments illustrated but changes may be made within the scope indicated by the appended claims, without departing from the spirit or sacrificing any of the advantages of this invention.

What is claimed is:

1. In a telephonic transmitter, the combination of a microphone, a source of carrier frequency, an antenna, a valve tube connected between this source of carrier frequency and said antenna, means connecting said microphone to said valve tube whereby said carrier frequency is modulated by signals from said microphone, a rectifier connected to the circuit of the microphone, a capacity in circuit with this rectifier and disposed in the grid circuit of the said valve tube, a second rectifier connected to the circuit of the microphone, a second valve tube, this second rectifier being arranged in the grid circuit of the second said valve tube, a tripping device and a direct current source both connected in the grid circuit of the second valve tube, and a capacity shunted to the anode circuit of the second said valve tube and connected in series with the first said capacity.

2. In a telephonic transmitter, the combination of a microphone, a source of carrier frequency, an antenna, a valve tube connected between this source of carrier frequency and said antenna, means connecting said microphone to said valve tube whereby said carrier frequency is modulated by signals from said microphone, a rectifier connected to the circuit of the microphone, a capacity in circuit with this rectifier and disposed in the grid circuit of the said valve tube, a second rectifier connected to the circuit of the microphone, a second valve tube, this second rectifier being arranged in the grid circuit of the second said valve tube, a tripping device, a direct current source, and retardation means, these three connected in the grid circuit of the second valve tube, and a capacity shunted to the anode circuit of the second said valve tube and connected in series with the first said capacity.

3. In a carrier or radio signalling system, the method of compensating for the intensity distortion of the detected signals occurring at the receiver due to non-linear rectification in the detector thereof which comprises varying the carrier frequency amplitude at the transmitter non-linearly with respect to the amplitude of the modulation frequencies, and employing modulation frequencies to modulate the carrier frequency thus varied.

4. In a carrier or radio signalling system, the method of compensating for the intensity distortion of the detected signals occurring at the receiver due to non-linear rectification in the detector thereof which comprises varying the carrier frequency amplitude at the transmitter non-linearly with respect to the amplitude of the modulation frequencies, distorting the smaller amplitudes of the modulating frequencies at the transmitter in the inverse sense and approximately in the same ratio as they are distorted at the receiver due to said non-linear rectification, and employing the modulating frequency so distorted to modulate the carrier frequency so varied.

5. In a carrier or radio signalling system, the method of compensating for the intensity distortion of the detected signals occurring at the receiver due to non-linear rectification in the detector thereof, which comprises varying the amplitude of the carrier frequency at the transmitter non-linearly with respect to the amplitude of the modulating frequencies, and employing the modulating frequencies to modulate the carrier frequency thus varied, whilst maintaining the amplitude of the carrier frequency above a fixed minimum value under control of the smaller amplitudes of the modulation frequencies.

6. In a carrier or radio signalling system, the method of compensating for the intensity distortion of the detected signals occurring at the receiver due to non-linear rectification in the detector thereof, which comprises varying the amplitude of the carrier frequency at the transmitter non-linearly with respect to the amplitude of the modulation frequencies, stepping the amplitude of the carrier frequency up to a predetermined value non-linear with respect to and under control of the smaller amplitudes of the modulation frequencies, and modulating the thus modified carrier frequencies in accordance with the modulation frequencies.

7. A radio telephone transmitter comprising a source of modulating signals, a carrier frequency source, an antenna, a modulating electron tube having its output circuit coupled to said antenna, means for connecting said sources to said modulating tube so that signal modulated carrier frequency produced thereby is impressed upon said antenna, a rectifier having its input circuit connected to said signal source, a second electron tube having its grid circuit connected to the output circuit of said rectifier and its plate circuit connected to said modulating tube, a direct current source in said grid circuit, means including a device in the output circuit of the rectifier responsive to signals from said signal source for altering the grid potential of the second electron tube thereby to control a critical amplitude of the carrier frequency in said modulating tube, and a second rectifier having its input circuit connected to said signal source and its output circuit connected to said modulating tube to vary the amplitude of the carrier frequency in accordance with amplitude variations of the signals.

8. A radio telephone transmitter comprising a source of modulating signals, a carrier frequency source, an antenna, a modulating electron tube having its output circuit coupled to said antenna, means for connecting the carrier frequency source to said modulating tube, means for amplifying signals from said signal source inversely in accordance with the amplitude thereof, means for impressing such amplified modulating signals upon said modulating tube so that the signal modulated carrier frequency produced thereby is impressed upon said antenna, a rectifier having its input circuit connected to said signal source, a second electron tube having its grid circuit connected to the output circuit of said rectifier and its plate circuit connected to said modulating tube, a direct current source in said grid circuit, means including a device in the output circuit of the rectifier responsive to signals from said signal source for altering the grid potential of the second electron tube thereby to control a critical amplitude of the carrier frequency in said modulating tube, and a second rectifier having its input circuit connected to said signal source and its output circuit connected to said modulating tube to vary the amplitude of the carrier frequency in accordance with amplitude variations of the signals.

9. A radio telephone transmitter comprising a source of modulating signals, a carrier frequency source, an antenna, a modulating electron tube having its output circuit coupled to said antenna, means for connecting the carrier frequency source to said modulating tube, means for amplifying signals from said signal source inversely in accordance with the amplitude thereof, means for impressing such amplified modulating signals upon said modulating tube so that the signal modulated carrier frequency produced thereby is impressed upon said antenna, and a rectifier having its input circuit connected to said signal source and its output circuit connected to said modulating tube to vary the amplitude of said carrier frequency in accordance with amplitude variations of the signals.

10. A radio telephone transmitter comprising a source of modulating signals, a carrier frequency source, an antenna, a modulating electron tube having its output circuit coupled to said antenna, means for connecting said sources to said modulating tube so that signal modulated carrier frequency produced thereby is impressed upon said antenna, a rectifier having its input circuit connected to said signal source, a second electron tube having its grid circuit connected to the output circuit of the rectifier and its plate circuit connected to said modulating tube, a direct current source in said grid circuit, means including a device in the output circuit of the rectifier progressively responsive to signals from said signal source for stepping up the grid potential of the second electron tube thereby to increase the amplitude of said carrier frequency in said modulating tube to a critical value, and a second rectifier having its input circuit connected to said signal source and its output circuit connected to said modulating tube to vary the amplitude of said carrier frequency in accordance with amplitude variations of the signals.

11. In a carrier or radio signalling system, the method of compensating for the intensity distortion of the detected signals occurring at the receiver due to non-linear rectification in the detector thereof, which comprises establishing a fixed value of the carrier frequency amplitude under control of the smaller intensities of the modulating frequencies, and varying the carrier frequency amplitude above said fixed value at the transmitter non-linearly with respect to said modulation amplitudes.

12. In a carrier or radio signalling system, the method of modulating transmitters employing a carrier frequency amplitude varying in accordance with the modulation amplitudes actually employed in the process of modulation and compensating for the intensity distortion of the detected signals occurring at the receiver due to non-linear rectification in the detector thereof, which comprises varying the carrier frequency amplitude at the transmitter non-linearly with respect to the original modulation intensities, and modulating the thus varied carrier frequency in accordance with the modulation frequencies.

13. In a carrier or radio signalling system, the method of compensating for the intensity distortion of the detected signals occurring at the receiver due to non-linear rectification in the detector thereof, which comprises varying the amplitude of the carrier frequency at the transmitter non-proportionally with respect to the amplitude of the modulating frequencies, and employing the modulating frequencies to modulate the carrier frequency thus varied, whilst maintaining the amplitude of the carrier frequency above a fixed minimum value under control of the smaller amplitudes of the modulation frequencies, said fixed minimum value corresponding to the lower end of the straight portion of the detection characteristic of the receiver.

14. In a carrier or radio signalling system, the method of compensating for the intensity distortion of the detected signals occurring at the receiver due to non-linear rectification in the detector thereof, which comprises establishing a fixed value of the carrier frequency amplitude under control of the smaller or zero intensities of the modulating frequencies, and varying the carrier frequency amplitude above said fixed value at the transmitter along such a curve that the different carrier frequency amplitudes along said curve bear varying ratios to the different corresponding modulation amplitudes, said fixed value corresponding to the lower end of the straight portion of the detection characteristic of the receiver.

15. In a carrier or radio signalling system, the method of compensating for the intensity distortion of the detected signals occurring at the receiver due to non-linear rectification in the detector thereof, which comprises establishing a fixed value of the carrier frequency amplitude under control of the smaller or zero intensities of the modulating frequencies, and varying the carrier frequency amplitude above said fixed value at the transmitter along such a curve that the different carrier frequency amplitudes along said curve bear varying ratios to the different corresponding modulation amplitudes, said curve of variation including in its initial portion a sudden upward step from said fixed value to a second fixed value.

LEO PUNGS.